United States Patent [19]

Tasch, Jr. et al.

[11] 4,228,445
[45] Oct. 14, 1980

[54] DUAL PLANE WELL-TYPE TWO-PHASE CCD

[75] Inventors: Al F. Tasch, Jr., Richardson; Pallab K. Chatterjee, Dallas, both of Tex.

[73] Assignee: Texas Instruments Incorporated, Dallas, Tex.

[21] Appl. No.: 845,982

[22] Filed: Oct. 27, 1977

[51] Int. Cl.³ .................... H01L 29/78; H01L 29/04; G11C 19/28
[52] U.S. Cl. ...................................... 357/24; 357/59; 357/91; 307/221 D; 29/589
[58] Field of Search ............... 357/24, 91; 307/221 D

[56] References Cited

U.S. PATENT DOCUMENTS

| | | | |
|---|---|---|---|
| 3,789,267 | 1/1974 | Krambeck et al. | 357/24 |
| 3,796,932 | 3/1974 | Amelio et al. | 357/24 |
| 3,852,799 | 12/1974 | Walden | 357/24 |
| 3,950,188 | 4/1976 | Bower | 357/24 |
| 4,035,906 | 7/1977 | Tasch et al. | 357/24 |
| 4,047,215 | 9/1977 | Frye et al. | 357/24 |
| 4,060,738 | 11/1977 | Tasch et al. | 357/24 |

Primary Examiner—Gene M. Munson
Attorney, Agent, or Firm—Melvin S. Sharp; Richard L. Donaldson; Jeffrey Van Myers

[57] ABSTRACT

A charge coupled device having geometries suitable for fabrication in high density packages (64,000 bits per chip–1,000,000 bits per chip) is comprised of a semiconductor substrate having dopant impurity atoms of a first type and a first surface. A charge transfer channel lies in the substrate near the first surface, and it is overlaid by an insulating layer of non-uniform thickness. A plurality of first and second electrodes lie on the insulating layer traversely to the channel. A well region of dopant impurity atoms of a second type opposite to the first type lies under each of the electrodes. The non-uniform insulating layer underlies each of the first electrodes by a first uniform thickness, underlies the second electrodes by a second uniform thickness, and separates the each of the first and second electrodes by approximately the second thickness. The second thickness is 20%–60% greater than the first thickness to greatly reduce interelectrode shorts in high density packages. A shallow layer of dopant impurity atoms of the second type may be provided under the second electrodes to compensate for shift flatband voltage shifts due to the thick insulating layer.

8 Claims, 17 Drawing Figures

Thickness 20 = 500Å
Underlying $Q_{is}$ = 1.2 × $10^{12}$/cm²
Thickness 21 = 800Å
Underlying $Q_{is}$ = 0.8 × $10^{12}$/cm²
Q of Region 60 = 3 × $10^{11}$/cm²

DUAL PLANE WELL-TYPE TWO-PHASE CCD

BACKGROUND OF THE INVENTION

This invention relates to charge coupled devices, and more particularly to charge coupled devices having extremely small geometries which are readily reproducible with a relatively high yield. Charge coupled devices are basically comprised of a semiconductor substrate having dopant impurity atoms of one type and a first surface. A charge transfer channel lies in the substrate near the first surface. An insulating layer lies on the first surface; and a plurality of electrodes lie spaced apart from each other on the insulating layer traversely to the charge transfer channel. Clocking voltages are applied to the electrodes to generate moving potential wells under the electrodes. Charge packets of minority charge carriers representing sampled analog signals or digital "bits" are propagated along the charge transfer channel in the potential wells.

In the past, the above generally described structure for a charge coupled device has been modified into various new and non-obvious structures. For example, some prior art charge coupled devices have relatively "flat" electrodes, have an insulating layer of a uniform thickness under all of the electrodes, and have regions of immobile charges in the substrate to form asymmetric potential wells under each electrode. In other charge coupled devices, each electrode is "stepped", the insulating layer under each of the electrodes is of a stepped thickness, and the stepped thickness forms asymmetric potential wells under the electrodes. As an example of the former structure, see U.S. Pat. No. 3,660,697 issued May 2, 1972, to Berglund et al, entitled, "Monolithic Semiconductor Apparatus for Sequential Charge Transfer". As an example of the latter structure, see U.S. Pat. No. 3,651,349 issued May 21, 1972 to Kahng et al., and having the same title.

The embodiments disclosed in the above references, along with other prior art embodiments work fine for packaging densities that are relatively small—that is, no larger than 16,000 bits per chip. However, they are not suitable for use in ultra-high density packages, such as memories containing from 256,000 bits per chip to 1,000,000 bits per chip. The "flat" electrode structure is more suitable for high density packages than the "stepped" electrode structure, because it yields a smaller cell size for any given minimum length dimension of the electrodes. But the "flat" electrode structure is unsuitable for high density packages because as the dimensions of the electrodes, the insulating layer, and the spaces between alternate electrodes is reduced (in order to get more bits of storage per unit area) the % yield of good chips to bad chips is also reduced. And when the dimensions are reduced to the point required to package 64,000 bits per chip, the % yield becomes so small as to make large scale manufacturing impractical. Chips of 64 K bits require a uniform insulating layer thickness of approximately 1,000 angstroms and an inter-electrode spacing of approximately 1,000 angstroms. With these dimensions, yields of 2%-10% are not uncommon.

Despite this problem, however, there is a large need for decreasing the geometries of charge coupled devices. For example, the history of the computer industry indicates a continual demand for larger and cheaper memories. Accordingly, the applicants have investigated the problem and discovered that a large percentage of the failures (50%-80%) are due to inter-electrode shorts. These shorts occur at random in the spaces between consecutive electrodes. These spaces are intended to be filled with an insulating layer; but the spaces are so small in chips containing 256,000 bits or more, that various process steps can—and often do—eliminate one or more of them. The exact process by which this occurs is disclosed in greater detail in conjunction with the description of the invention.

Accordingly, it is one object of the invention to provide a new and non-obvious charge coupled device structure.

Still another object of the invention is to provide a charge coupled device structure having geometries which are readily fabricated in an ultra high density package with relatively few inter-electrode shorts.

SUMMARY OF THE INVENTION

These and other objectives are accomplished in accordance with the invention by a charge coupled device comprised of a semiconductor substrate having dopant impurity atoms of a first type and first surface. A charge transfer channel lies in the substrate near the first surface. An insulating layer of non-uniform thickness lies on the first surface over the channel. A plurality of first electrodes lie spaced apart from each other on the insulating layer traversely to the channel. A plurality of second electrodes lie on the insulating layer traversely to the channel in the spaces between first electrodes. A well region of dopant atom of a second type opposite to the first type lies under each of the electrodes near the first surface in the channel. The non-uniform insulating layer underlies the first electrodes by a first uniform thickness, underlies the second electrodes by second uniform thickness, and separates each of the first electrodes from the adjacent electrodes by approximately the second uniform thickness. The second uniform thickness is greater than the first uniform thickness and greatly reduces inter-electrode shorts in ultra high density packages. Dopant impurity atoms of the first type, and of the second type lie under the electrodes in a manner which maximizes charge capacity and charge transfer efficiency-thereby compensating for adverse operational properties of the non-uniform insulating layer.

DETAILED DESCRIPTION

Figure 1:
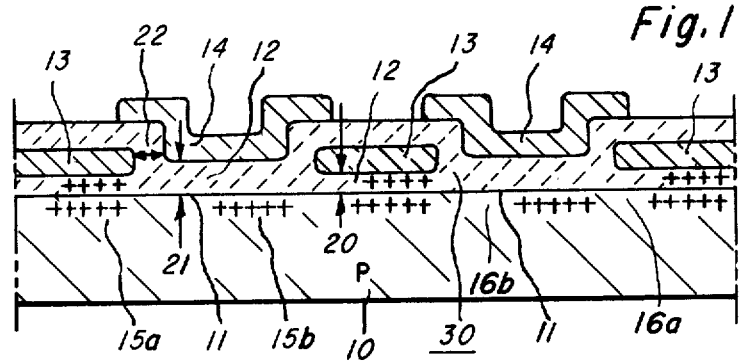
FIG. 1 is a greatly enlarged cross-sectional view of a first embodiment of the invention.

A charge coupled device constructed according to the invention, and hereinafter called the first embodiment, will now be described in conjunction with FIG. 1. As therein illustrated, the first embodiment is comprised of a semiconductor substrate 10 having dopant impurity atoms of first type and having a first surface 11. The one type dopant impurity atoms are indicated in FIG. 1 as being P-type as an example. A charge transfer channel is formed in substrate 10 near surface 11. FIG. 1 is a greatly enlarged cross-sectional view taken along a portion of this charge transfer channel. An insulating layer 12 of non-uniform thickness lies on surface 11 over the channel. A plurality of electrodes 13 are spaced apart from each other and lie on insulating layer 12 traversely to the channel. Similarly, a plurality of electrodes 14 lie on insulating layer 12 traversely to the channel in the spaces between the spaced apart electrodes 13. Well regions 15a and 15b of the dopant impurity atoms of a second type opposite to the first type lies under each of the electrodes 13 and electrodes 14, respectively. Each of the well regions 15a and 15b extends transversely across the channel and along said channel from one transverse edge of a respective one of the electrodes 13 and 14 to a medial portion thereof. Insulating layer 12 underlies electrodes 13 by first uniform thickness 20, underlies electrodes 14 by second uniform thickness 21, and separates each of the electrodes 13 from adjacent electrodes 14 by a thickness 22 which is approximately equal to thickness 21. Thickness 22 and 21 are larger than thickness 20. In chips of 65,000 bits-1,000,000 bits, this insulating layer architecture greatly reduces inter-electrode shorts between electrodes 13 and 14.

The following parameters are illustrative as only one example of the dimensions involved when the first embodiment is packaged with 256,000 bits per chip. Thickness 20 may be approximately 500 angstroms; thickness 21 may be 700 angstroms-900 angstroms; and thickness 22 may be approximately 20-30% greater than thickness 21. Electrodes 13 and 14 are approximately (2,000-3,000) angstroms thick and have a length of approximately 4 microns. The charge transfer channel width is approximately 4 microns. As an example of the charge densities involved substrate 10 may have a charge density of approximately $(1-10) \times 10^{15}$ dopant atoms per $cm^3$; well regions 15a under electrodes 13 may have a charge density of approximately $(1.0-1.4) \times 10^{12}$ atoms per $cm^2$ with a distribution peak approximately (0-1,000) angstroms from surface 11; and the well regions 15b under electrodes 14 may have a charge density of approximately $(0.6-1.0) \times 10^{12}$ atoms per $cm^3$ with a distribution peak approximately (200-1,000) angstroms from surface 11. In other chips of higher or lower packing densities, the above parameters may be scaled smaller or larger, respectively.

Figure 2:
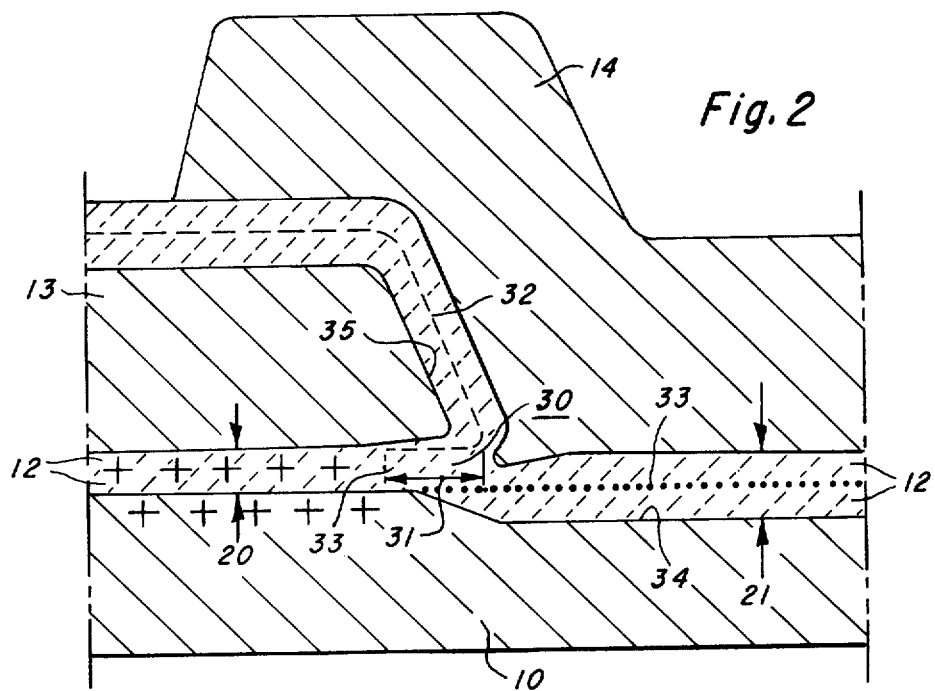
FIG. 2 is a detailed view of a region 30 in the first embodiment.

Referring now to FIG. 2, there is illustrated a greatly enlarged cross-sectional view of a critical portion of the structure of FIG. 1. More specifically, FIG. 2 is an enlarged view of a region 30 between one of the electrodes 13 and an adjacent electrode 14. This figure illustrates how the disclosed structure greatly reduces inter-electrode shorts in high density packages. During the process of fabricating the structure of FIG. 1, electrodes 13 are patterned; and then the portion of insulating layer 12 lying in the spaces between electrodes 13 is removed. When this portion of insulating layer 12 is removed, a portion of the insulating layer underlying electrode 13 is also unavoidably removed. That is, the insulating layer 12 under electrode 13 is undercut as indicated at 30 in FIG. 2. The depth 31 of this undercut is approximately 500 angstroms in a chip having 256,000 bits as an example. Dashed lines 32 indicate the profile of electrode 13 after insulating layer 12 between electrodes 13 is removed and before it is regrown. Similarly, dotted line 33 indicate the surface of substrate 10 at this stage in the process.

Subsequently, the insulating layer 12 between electrodes 13 is regrown; and this step partially consumes substrate 10 and electrodes 13 such that they have a profile as indicated at 34 and 35, respectively. The amount by which the surfaces are consumed by the process of regrowing insulating layer 12 is approximately one-half the depth of the insulating layer that is grown. As a result of this surface consumption and the above described undercutting, the insulating layer 12 in region 30 will not be thick enough to electrically separate adjacent electrodes in high density chips-unless thickness 21 is made greater than thickness 20. Preferably, thickness 21 is 20%-60% larger than thickness 20.

Figure 3:
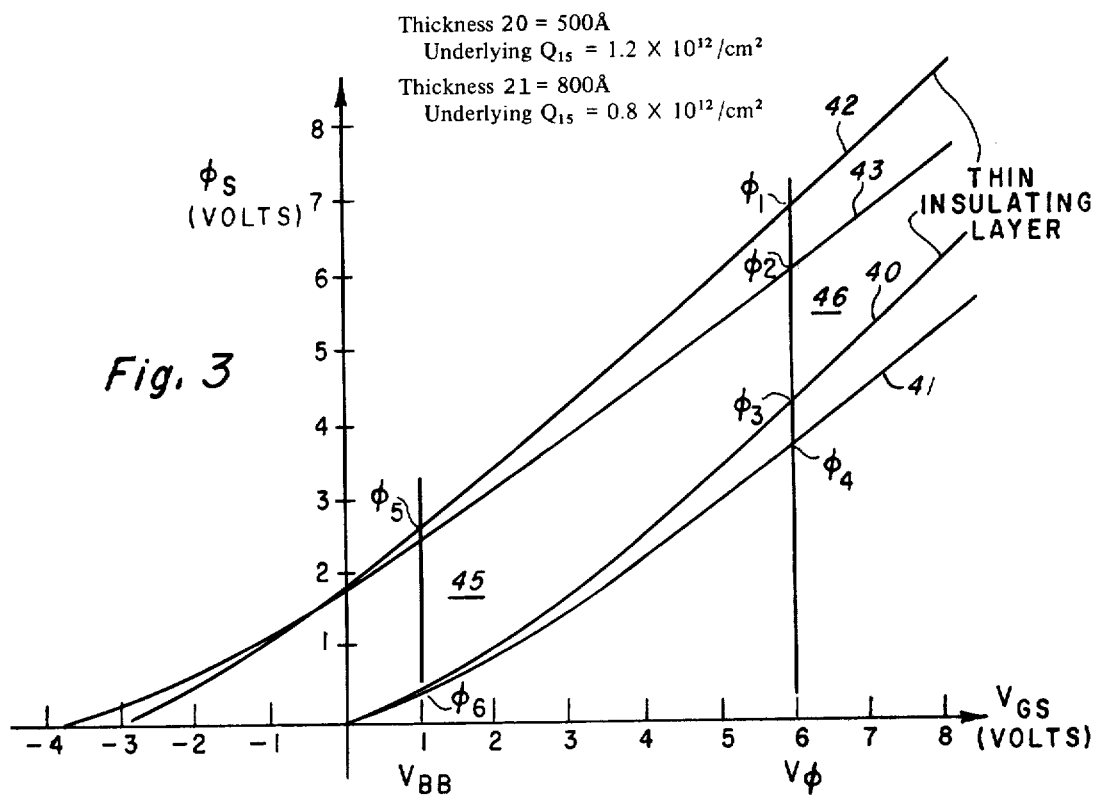
FIG. 3 is a set of curves illustrating the surface potential versus gate to substrate voltage at various points in the first embodiment.
Figure 4:
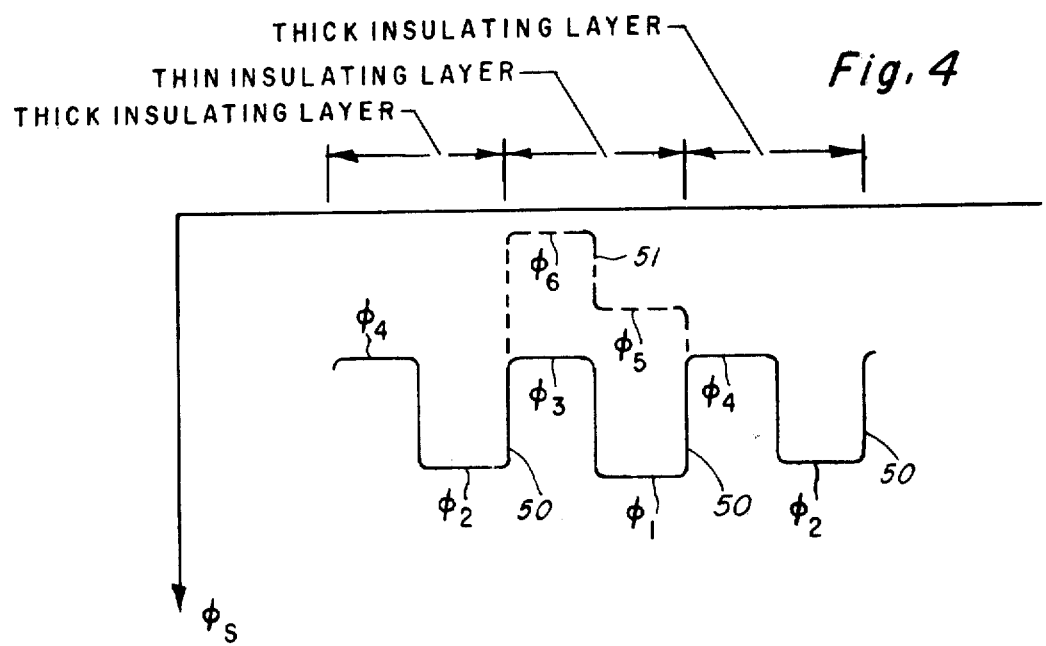
FIG. 4 is a set of curves illustrating the surface potential along the charge transfer channel of the first embodiment.

The operation of the disclosed first embodiment is best described by the diagrams of FIGS. 3 and 4. FIG. 4 is a representative plot of the surface potential versus gate to substrate voltage at various points along the charge transfer channel of the first embodiment. The thickness parameters 20 and 21 along with the charge densities of dopant atoms in the well regions 15a and 15b is given therein. It is important to note that the operating voltage $V_{BB}$ and $V_\phi$ are not the usual +5 and +17 volts, but are +1 and +6 volts respectively. Lower operation voltages are required in the high density structure because of the thin insulating layers involved.

In FIG. 3 a curve 40 illustrates the surface potential versus gate to substrate voltage under electrodes 13 in a barrier region 16a between the well regions 15a and 15b. Similarly, the surface potential versus gate to substrate voltage under electrodes 14 in a barrier region 16b between adjacent well regions 15a and 15b is given by a curve 41. Comparison of curves 40 and 41 illustrates the operational effect of insulating layer 12 having one thickness under electrode 14 and having another thickness under electrode 13. The increased thickness 21 under electrode 14 causes curve 41 to have a more non-linear shape under a relatively low gate to substrate voltage condition. This is illustrated generally at 45. The increased thickness 21 also causes the surface potential under electrode 14 to be less than the surface potential under electrode 13 for any given relatively high gate to substrate voltage as indicated generally at 46.

Also in FIG. 3, a curve 42 illustrates the relationship between surface potential and gate to substrate voltage under electrodes 13 in the well regions 15a; while a curve 43 illustrates surface potential versus gate to substrate voltage under electrodes 14 in the well regions. Curve 42 has the same shape as curve 40, but it is shifted to the left. This shift is caused by the dopant impurity atoms in the well regions 15a. Similarly, curve 43 has the same shape as curve 41, but it too is shifted to the left. This shift is also due to the effect of dopant impurity atoms in the well regions 15b. However, the amount of shift is directly proportional to the thickness of the insulating layer 12 as well as the charge density of dopant impurity atoms in the well regions 15b. Thus, in order to provide an approximately equal amount of shift, the dopant impurity atoms in the well regions 15b under electrodes 14 should have a smaller charge density than the dopant impurity atoms in the well regions 15b under electrodes 13. Preferably, in the first embodiment, the charge density of dopant impurity atoms in the well regions 15b under electrodes 14 is approximately equal to the products of the charge density of dopant impurity atoms in the well regions 15b under electrodes 13 and the ratio of insulating layer thickness 20 to insulating layer thickness 21.

FIG. 4 illustrates the surface potential taken along the charge transfer channel of the first embodiment under various electrode clocking conditions. In particular, a curve 50 illustrates the surface potential under electrodes 13 and 14 when the phase clock voltages applied thereto are both on. This condition occurs when overlapping phase clocks are used. Under this condition, the surface potential at various points along the charge transfer channel near surface 11 has values $\phi_1 - \phi_4$ as indicated in FIG. 4. The values $\phi_1 - \phi_4$ are taken from FIG. 3 under the condition where $V_{gs} = 6$ V.

The surface potentials $\phi_1 - \phi_4$ may be utilized to examine the charge capacity of the first embodiment. Its charge capacity is proportional to the oxide capacitance under electrodes 14 times the gate to substrate voltage required to shift the surface potential from $\phi_2$ to $\phi_3$. By comparison, the charge capacity of a conventional charge-coupled device having a uniformly thick insulating layer of thickness 20 is proportional to the oxide capacitance under electrodes 13 times the gate to substrate voltage required to shift the surface potential from $\phi_1$ to $\phi_3$. By inspection of FIG. 4, it is evident that the device of FIG. 1 has less charge capacity than conventional devices having a uniformly thin insulating layer. But this decreased charge capacity is relatively unimportant, however, since conventional charge-coupled devices having a single uniform thickness are practically unreproducible with small geometries due to the above described inter-electrode shorting. In addition, the decreased charge capacity can easily be increased by use of non-overlapping phase clock voltages. In that case, charge capacity of the first embodiment is proportional to the oxide capacitance under electrodes 14 times the gate to substrate voltage required to shift the surface potential from $\phi_2$ to $\phi_4$.

A curve 51 in FIG. 4 illustrates the surface potential taken along the charge transfer path of the first embodiment under the condition where the clock voltage applied to electrodes 14 is on and the clock voltage applied to electrodes 13 is off. Under this condition, the surface potentials under electrodes 13 in the well regions 15a and the barrier regions are 16a $\phi_5$ and $\phi_6$, respectively. Values $\phi_5$ and $\phi_6$ are taken directly from the curves of FIG. 3. In order to transfer charge packets from under electrodes 13 to the adjacent electrodes 14, the value $\phi_4$ must be greater than $\phi_5$. This condition is satisfied by the structure of FIG. 1 as indicated in FIG. 4. In addition, the difference between $\phi_4$ and $\phi_5$ may be increased by utilizing larger clock voltages on electrodes 13 and 14.

Figure 5:
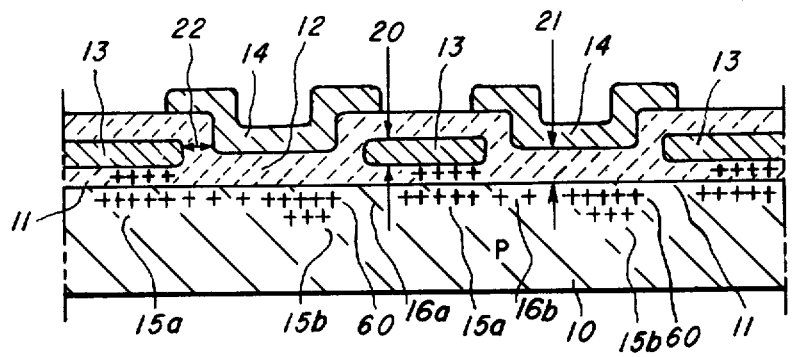
FIG. 5 is a cross-sectional view of a second embodiment of the invention.

Referring now to FIG. 5, a second embodiment of the invention is illustrated. The embodiment of FIG. 5 is similar to that of FIG. 1; and the similar portions are indicated with like reference numerals. The major difference between the two embodiments is that the second embodiment includes a region 60 of dopant impurity atoms of the second type under each of the electrodes 14. Each of the regions 60 extends transversely across the channel and along said channel from one transverse edge of a respective one of the electrodes 14 to the opposite transverse edge thereof. In a chip containing 256,000 bits, region 60 may suitably have a distribution peak approximately 100 angstroms–500 angstroms from surface 11, and a charge density of approximately $1-7 \times 10^{11}$ dopant atoms per cm$^2$, as an example.

Figure 6:
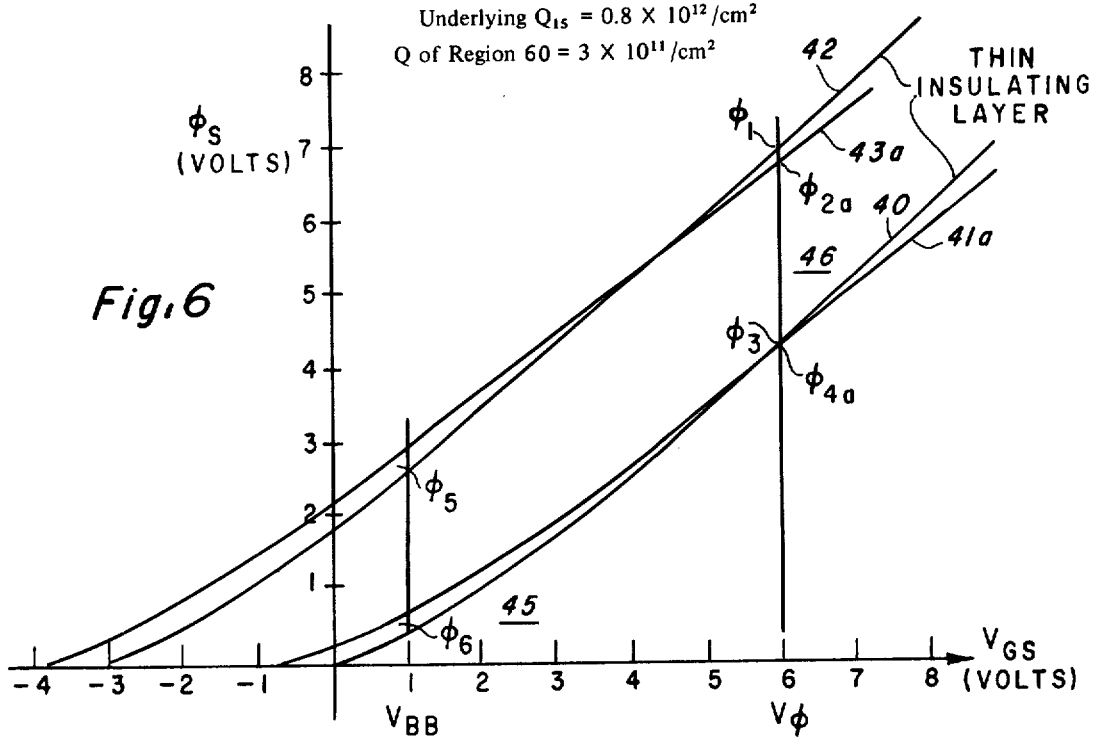
FIG. 6 is a set of curves illustrating the surface potential versus gate to substrate voltage at several points in the second embodiment.
Figure 7:
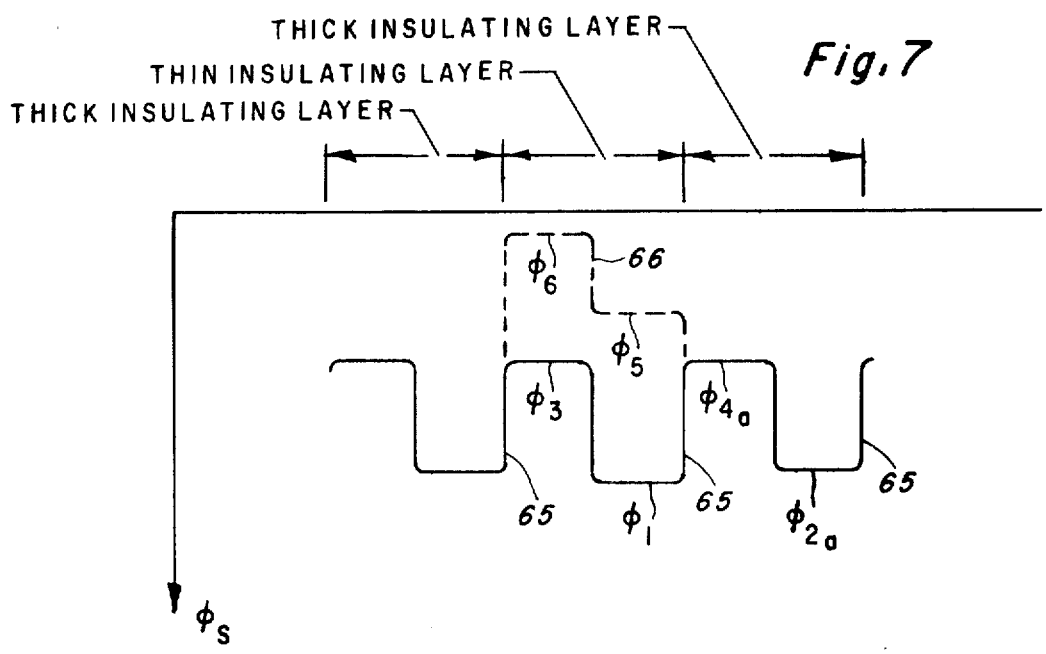
FIG. 7 is a set of curves illustrating the surface potential along the charge transfer channel of the second embodiment.

The operation of the second embodiment is illustrated in FIGS. 6 and 7. In particular, FIG. 6 is a representative plot of a set of curves 40, 41a, 42 and 43a illustrating surface potential versus gate to substrate voltage at various points along the charge transfer channel of the second embodiment. Thickness parameters 20 and 21, along with the various charge densities involved are labeled thereon. Curves 40 and 42 in FIG. 6 are the same as curves 40 and 42 in FIG. 3. This is because region 60 in the second embodiment does not affect the surface potential under electrodes 13. In comparison, curves 41a and 43a of FIG. 6 have the same shape as curves 41 and 43 of FIG. 3; but they are shifted to the left. That is, region 60 of dopant impurity atoms has the effect of shifting the flatband voltage under electrodes 14 in the negative direction. The amount of shift is proportional to the charge density of the dopant atoms in region 60 and to the thickness 21 of insulation layer 12.

In the preferred form of the second embodiment embodiment, this charge density and thickness is chosen such that the amount of shift places curves 41a and 43a in close proximity to curves 40 and 42, respectively. As a result, the second embodiment has improved charge capacity over the first embodiment when overlapping phase clock voltages are used. It also has improved charge transfer efficiency. This is illustrated by the surface potential diagram of FIG. 7. In FIG. 7, a curve 65 illustrates the surface potential along a portion of the charge transfer path of the second embodiment for the condition where the phase one clock voltage and phase two clock voltage are both on. As curve 65 indicates, the charge capacity under electrodes 14 is proportional to the oxide capacitance under electrodes 14 times the gate to substrate voltage required to shift the surface potential from $\phi_{4a}$ to $\phi_{2a}$. The difference between surface potential $\phi_{4a}$ and $\phi_{2a}$ is greater than the difference between surface potentials $\phi_3$ and $\phi_2$ which were previously described in conjunction with FIG. 4. Thus, the charge capacity of the second embodiment increases by a proportionate amount.

Also, in FIG. 7, a curve 66 indicates the surface potential along the charge transfer channel of the second embodiment under the condition where the clock voltages applied to electrodes 13 are off, while the clock voltages applied to electrodes 14 are on. Under this condition, the surface potential under electrodes 13 is $\phi_5$ and $\phi_6$ in the well and barrier regions 16a and 15a, respectively. Values $\phi_5$ and $\phi_6$ are taken directly from FIG. 6. In order for charge to transfer from under electrodes 13 to under electrodes 14, the surface potential value $\phi_5$ must be—and is—greater than the surface potential $\phi_{4a}$. Also, the difference between $\phi_5$ and $\phi_{4a}$ is greater than the difference between values $\phi_5$ and $\phi_4$ which were previously described in conjunction with FIG. 4. Thus, the second embodiment has increased charge transfer efficiency over the first embodiment.

Figure 8:
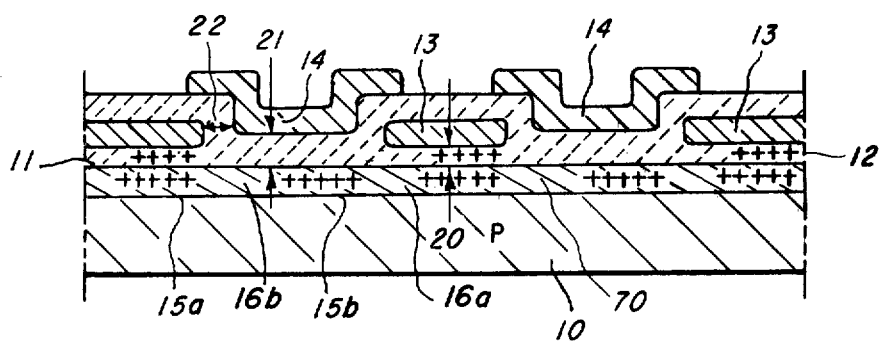
FIG. 8 is a greatly enlarged cross-sectional view of a third embodiment of the invention.

Still another embodiment of the invention, hereinafter called the third embodiment, is illustrated in FIG. 8. The third embodiment is similar to the first embodiment with the exception that the former includes a buried channel region 70. Buried channel region 70 contains the charge transfer channel and has dopant impurity atoms of the second type. Suitably, the charge distribution peak of region 70 lies 2,000 angstroms to 10,000 angstroms from surface 11 and has a peak charge density of approximately $1.4 \times 10^{12}$ dopant atoms per $cm^2$.

Figure 9:
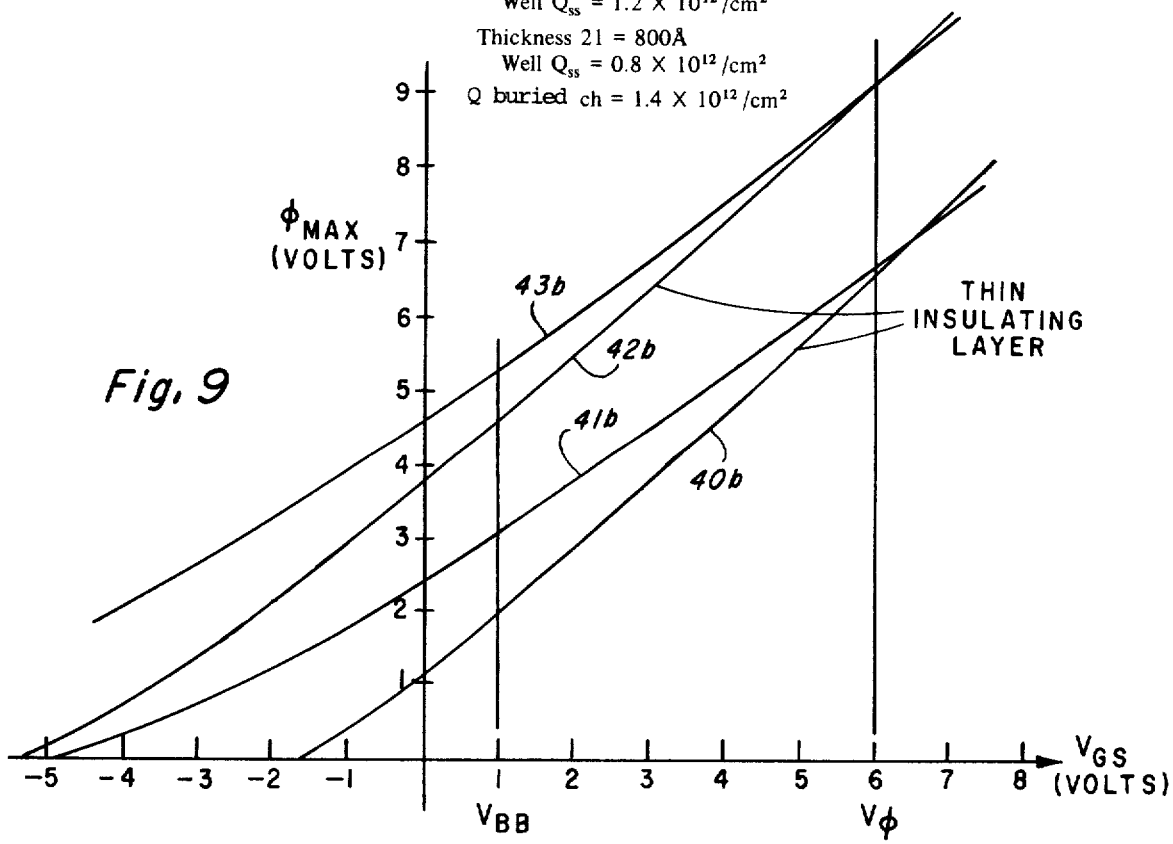
FIG. 9 is a set of curves illustrating channel potential versus gate to substrate voltage at various points within the third embodiment.

The effect of buried channel region 70 on the operation of the third embodiment is illustrated in FIG. 9. That figure contains curves 40b–43b which indicate the channel potential versus gate to substrate voltage at various points along the buried channel for various phase clock voltage conditions. Curves 40b–43b are similar in shape to curves 40–43 of FIG. 3, but they are shifted to the left. That is, the effect of buried channel region 70 is to both shift the maximum potential from surface 11 to below surface 11, and to shift the flatband voltage in the negative direction. The amount of flatband voltage shift is inversely proportional to the thickness of the overlying insulating layer. And thus, curves 41 and 43 shift by a larger amount than do curves 40 and 42. In the example illustrated in FIG. 10, curve 41b lies approximately midway between curves 40b and 42b; while curve 43b lies to the left of curve 42b. This misalignment of curves 40b and 42b with curves 41b and 43b results in decreased charge capacity when non-overlapping clocks are used over a conventional buried channel charge coupled device having an insulating layer of a single uniform thickness. A detailed analysis of a similar effect was previously described in conjunction with FIG. 3. On the other hand, the structure of FIG. 8 is highly reproducible in high density packages. In addition, improved charge capacity is achievable in this embodiment simply by utilizing overlapping clocks rather than non-overlapping clocks.

Figure 10:
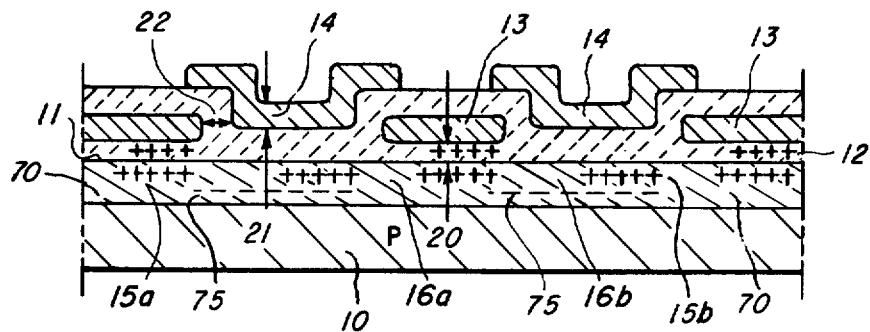
FIG. 10 is a greatly enlarged cross-sectional view of a fourth embodiment of the invention.

A fourth embodiment of the invention is illustrated in FIG. 10. The fourth embodiment is similar in structure to the embodiment of FIG. 8; and like reference numerals indicate the similar portions. The fourth embodiment differs, however, from the FIG. 8 embodiment in that it further includes a shallow region 75 of dopant impurity atoms of the first type under each of electrodes 14. Each of the regions 75 extends transversely across the charge transfer channel and along said channel from one transverse edge of a respective one of the electrodes 14 to the opposite transverse edge thereof. In a 256,000 bit chip, region 75 may have a distribution peak approximately 200 angstroms–1,000 angstroms from surface 11; and a peak charge density of approximately $1-7 \times 10^{11}$ dopant atoms per $cm^2$ as an example.

Figure 11:
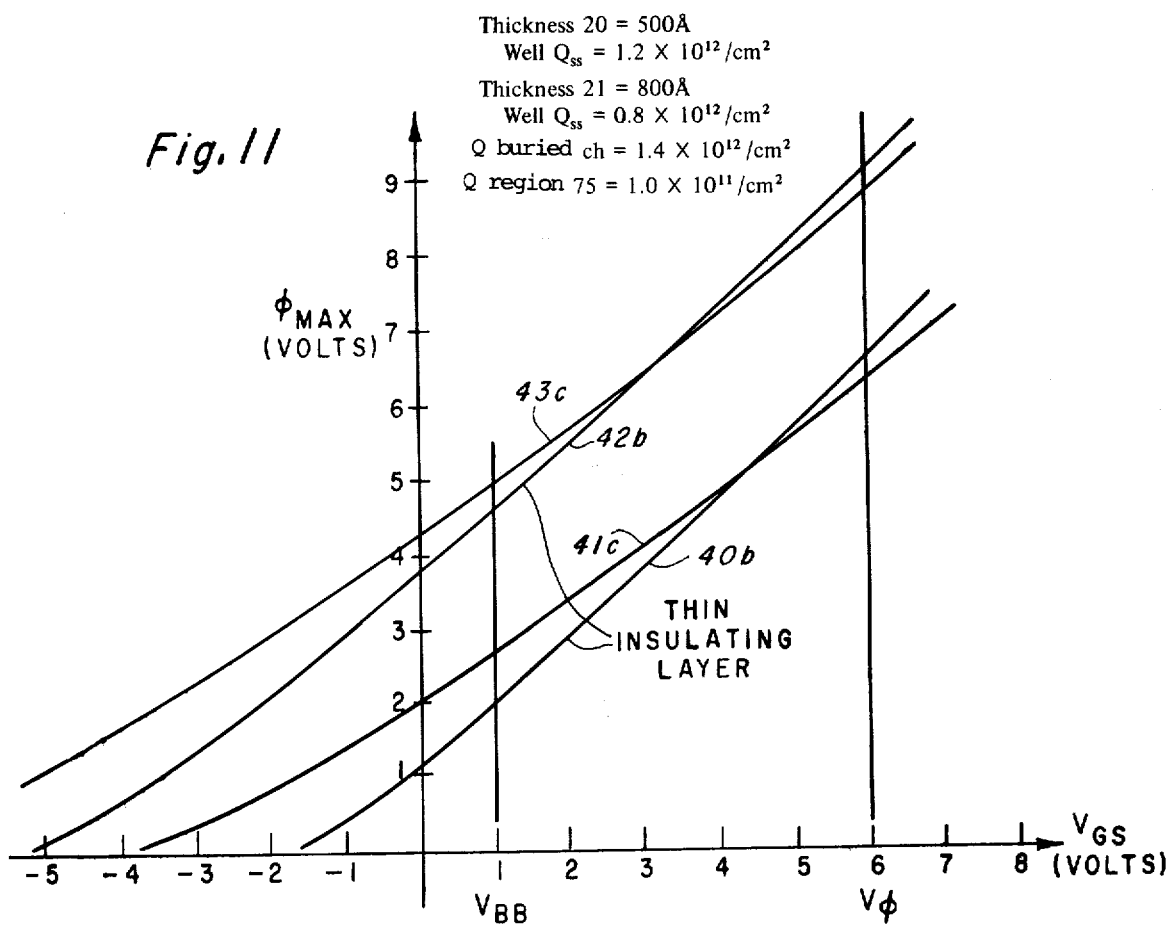
FIG. 11 is a set of curves illustrating channel potential versus gate to substrate voltage at various points in the fourth embodiment.
Figure 12:
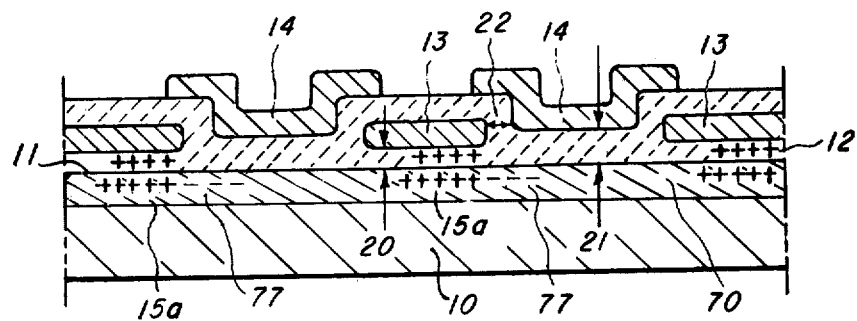
FIG. 12 is a greatly enlarged cross-sectional view of a fifth embodiment of the invention.

The effect of the dopant impurity atoms of region 75 on the operation of the device of FIG. 10 is illustrated in FIG. 11. In particular, FIG. 12 is a representative plot showing variation of the maximum channel potential as a function of gate to substrate voltage at various points along the charge transfer channel of the fourth embodiment. Curves 40b and 42b illustrate the surface potential variation under electrodes 13. They are the same as curves 40b and 42b in FIG. 9. In addition, curves 41c and 43c illustrate the surface potential under electrodes 14 in the barrier and well regions 16b and 15b respectively. They are similar to curves 41b and 43b of FIG. 10 but are shifted to the right. That is, the dopant impurity atoms of region 75 shift the flatband voltage under electrodes 14 in a positive direction. As a result, curves 41c and 43c are in close proximity to curves 40b and 42b, respectively. This in turn results in increased charge storage capacity and increased charge transfer efficiency as previously described in conjunction with FIGS. 6 and 7.

Still another embodiment of the invention, hereinafter referred to as the fifth embodiment, is illustrated in FIG. 12. The fifth embodiment is similar in operation to the fourth embodiment, but well regions exist under the electrodes 13 only and not under the phase electrodes 14. In addition, a barrier region 77 of dopant impurity atoms of the first type lie under each of the electrodes 14. Each of the barrier regions 77 extends transversely across the channel from and along the channel from the transverse edge of the well region 15a under a respective one of the electrodes 13 to a medial portion of an adjacent electrode 14. The architecture of the fifth embodiment is otherwise the same as that of the fourth embodiment, and like reference numerals identify the similar portions.

The operation of the fifth embodiment of the invention will now be explained by referring back to FIG. 10 and reconsidering the effect of dopant implants 75 and 15 under electrodes 14. Implants 75 and 15 both lie at relatively the same distance from surface 11; and thus they have a cancelling effect on each other. This cancelling effect is utilized by the fifth embodiment in that implant 15 and the underlying portion of implant 75 are eliminated.

Alternatively, the operation of the fifth embodiment may be explained in terms of the channel potential diagram of FIG. 11. In FIG. 12, curve 43c represents the surface potential under electrodes 14 adjacent the barrier regions 77. The effect of adding dopant atoms in the barrier region 77 under electrodes 14 is to shift the flatband voltage in the positive direction as illustrated by curve 41c. Accordingly, the fifth embodiment of the invention has the same surface potential versus gate voltage characteristics as the fourth embodiment of the invention; and both of these embodiments have improved charge storage capacity and charge transfer efficiency in addition to being readily reproducible in high density packages without inter-electrode shorts.

As in such prior art devices as those shown in the U.S. Pat. Nos. 3,651,349 and 3,660,697, cited above, each of the embodiments shown in FIGS. 1, 5, 8 and 10 includes a conventional reverse-biased output diode for depleting the charge transfer channel, so that charge packets injected via a conventional input diode may be detected after transit of the charge transfer channel. As will be clear to those skilled in the art, the minimum operating voltages for the input and output diodes may be easily determined for each of the embodiments of FIGS. 1, 5, 8 and 10 using the graphs of FIGS. 3, 6, 9 and 11, respectively. Using the surface channel embodiment shown in FIG. 1 as an example, it can be seen in FIG. 3 that the example clock voltage $V_\phi$ produces a maximum $\phi_S$ of approximately 7 volts. Since the output diode must remain in a reverse-biased condition, it follows that the biasing voltage for the output diode must be greater than about 7 volts. Similarly, to prevent the input diode from becoming inadvertantly forward-biased, the minimum disable voltage applied to the input diode must be greater than about 7 volts. In contrast, it can be seen from FIG. 9 that the corresponding minimum operating voltages for the input and output diodes in the buried channel embodiment of FIG. 8 is approximately 9 volts. In the buried channel embodiment, the biasing voltage would also be thereby applied to the buried channel region 70 underlying electrodes 13 and 14.

Referring now to FIGS. 13a-13e, a process for constructing all of the above described embodiments of the invention is illustrated. To begin, insulating layer 12 is formed on surface 11 of substrate 10 such that it has the first uniform thickness 20 over the entire charge transfer channel. Then, photoresist 80 is disposed on top of insulating layer 12; and it is patterned to form spaced apart openings lying traversely to the charge transfer channel. These openings define the well region under phase electrodes 13 plus a portion of the barrier region underlying phase electrodes 14. Dopant impurity atoms 81 of the second type are then implanted into insulating layer 12 in the spaces between photoresist regions 80. Suitably, a charge density of $4 \times 10^{13}$ atoms per $cm^2$ and an implant energy of 25 KeV for arsenic atoms may be used. Alternatively, atoms 81 may be implanted with a higher energy through insulating layer 12 directly into substrate 10 near surface 11. Suitably, arsenic atoms of a charge density of $2.5 \times 10^{12}$ atoms per $cm^2$ and an energy of 90 KeV may be used.

Next, the photoresist 80 is removed and a layer of polysilicon is formed on top of insulating layer 12. This polysilicon is then patterned to form phase electrodes 13 as illustrated in FIG. 13b. Phase electrodes are patterned such that they partially overlie dopant atoms 81. Then, the portion of insulating layer 12 lying between electrodes 13 is removed by a step such as selective etching. As a result of this step, the portion of dopant atoms 81 lying between electrodes 13 is removed; while the portion of dopant atoms 81 underlying phase electrodes 13 is not removed. This forms the well region in the barrier regions 15a under electrodes 13. Also this step undercuts the insulating layer 12 in region 30 of electrodes 13. This undercutting is indicated in general in FIG. 13c; and was previously illustrated in detail in FIG. 2. If the dopant atoms are implanted through the insulating layer into the substrate, then it will be necessary to remove that portion of the substrate which contains the dopant atoms.

Figure 13A:
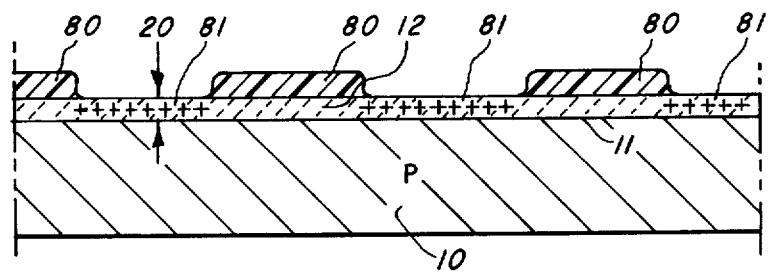
FIGS. 13a-13e are greatly enlarged cross-sectional views illustrating the process of constructing the various embodiments.
Figure 13B:
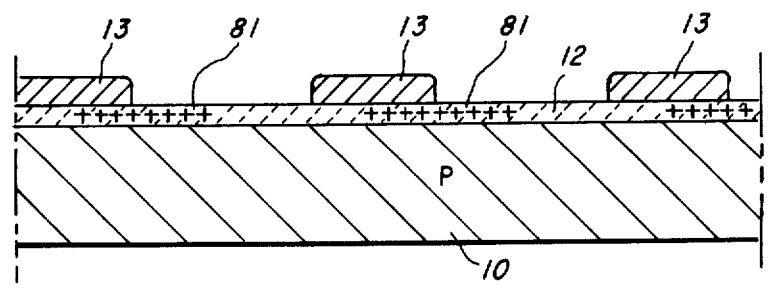
Figure 13C:
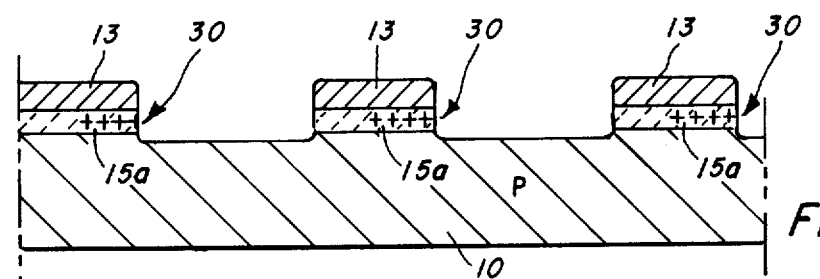

Alternatively, the FIG. 13c structure may be constructed by forming the patterned photoresist 80 of FIG. 13a directly on surface 11 before insulating layer 12 of thickness 20 is formed. Dopant atoms 81 are then implanted directly into substrate 10 near surface 11. Arsenic atoms of a density of $3 \times 10^{12}$ atoms per $cm^2$ and an implant energy of 15 KeV are suitable as an example. Subsequently, insulating layer 12 of thickness 20 is formed on surface 11. Then the steps described above in conjunction with FIGS. 13b and 14c are performed with the etching step of FIG. 13c also removing substrate 10 near surface 11 between electrodes 13.

Figure 13D:
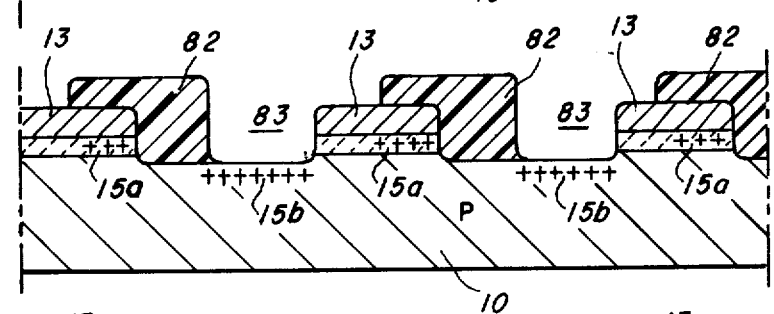

The structure of FIG. 13c is subsequently modified by a patterned layer of photoresist 82 as indicated in FIG. 13d. That is, photoresist 82 is patterned to expose the well regions for phase electrodes 14 and to expose portions of electrodes 13. Dopant atoms of the second type are then implanted into substrate 10 near surface 11 through the openings 83 defined by photoresist 82 and phase electrodes 13. Suitably, arsenic atoms of a charge density of $3.0 \times 10^{12}$ atoms per $cm^2$ and an implant energy of 30 KeV may be utilized as an example.

Figure 13E:
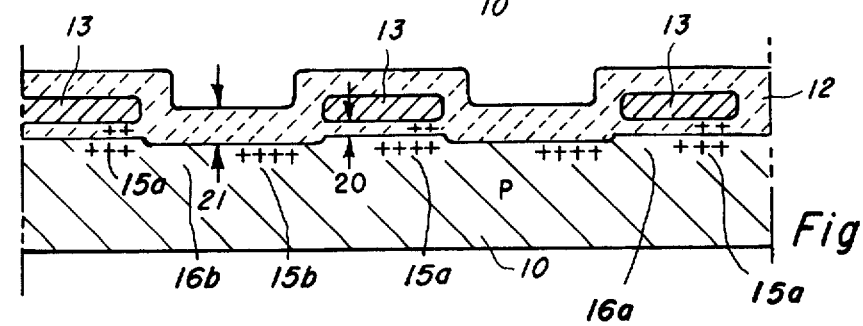

Subsequently, insulating layer 12 is reformed in the spaces between phase electrodes 13 and on top of phase electrodes 13. During this step, insulating layer 12 is formed to the second thickness 21 which is greater than thickness 20. FIG. 13e illustrates these two thicknesses. Also during this step—or a subsequent high temperature step—the dopant atoms 15 in the thin insulating layer diffuse into the underlying substrate.

Alternatively, insulating layer 12 may be regrown before photoresist 82 is patterned. In that case, the dopant atoms 15 for the well region between electrodes 13 may be implanted through openings 83 into substrate 10 directly through insulating layer 12; or they may be implanted into insulating layer 12 and diffused out to the underlying surface 11. In the former case, an implant dosage of approximately $1.6 \times 10^{12}$ atoms per $cm^2$ and an implant energy of approximately 120 KeV may be utilized as an example; while in the latter case an implant dosage of approximately $2 \times 10^{13}$ atoms per $cm^2$ and an implant energy of approximately 40 KeV may be utilized.

By modifying the above described steps, the embodiments of FIGS. 5, 8, 10, and 12 may also be constructed. For example, to construct the embodiment of FIG. 5, an implant step is performed between electrodes 13 in the structure of FIG. 13c to form regions 60 of dopant atoms. Suitably, an implant dosage of $3 \times 10^{11}$ atoms per $cm^2$ and an implant energy of 40 KeV may be utilized as an example. Similarly, to construct the buried channel embodiments of FIGS. 8 and 10, an implant step, which forms buried channel 70 is performed before any of the steps described in conjunction with FIGS. 13a-13e are performed.

In order to construct the embodiment of FIG. 12, the steps described above in conjunction with FIGS. 13a-13c are first performed. Then, photoresist is disposed on the structure of FIG. 13c and is patterned just the opposite of the pattern of photoresist 82 of FIG. 13d. That is, the photoresist is patterned to expose the barrier regions lying between the electrodes 13 as opposed to the well regions lying between electrodes 13. Then, dopant atoms of the first type are implanted into region 77 as defined by the patterned photoresist. Suitably, an implant dosage of $1.4 \times 10^{12}$ atoms per $cm^2$ and an implant energy of 100 KeV may be utilized as an example.

Next, insulating layer 12 is regrown to a thickness 21 between phase electrodes 13 as was previously described in conjunction with FIG. 13e. Alternatively, the dopant atoms of region 77 may be implanted through insulating layer 12; or they may be implanted into insulating layer 12 and diffused out to the underlying substrate as previously described.

A number of embodiments of the invention have now been described in detail; and various changes and modifications can be made to these details without departing from the nature of the invention. For example, electrodes 13 or 14 may be made of $MoSi_2$ or $W\,Si_2$, or other silicide of refractory metals. These have characteristics much like polysilicon, but have approximately ten times less resistance which may be important in high density packages. As another modification, insulating layer 12 in the portion of thickness 21 may be comprised of two different materials—such as $Si_3N_4$ on top of $SiO_2$. This modification would result in an improved charge capacity since the charge capacity of a potential well is proportional to $\epsilon A/d$, and $\epsilon$ is greater for $Si_3N_4$ than for $SiO_2$. Since many changes and modifications can be made to the above described embodiments without departing from the nature and spirit of the invention, it is understood that the invention is not to be limited to said details except as set forth in the appended claims.

What is claimed is:

1. A charge-coupled device comprised of:
   (a) a semiconductor substrate having dopant impurity atoms of a first type and a first surface;
   (b) a charge-transfer channel in said substrate near said first surface;
   (c) an insulating layer of non-uniform thickness on said first surface over said channel;
   (d) a plurality of first electrodes spaced apart from each other and lying on said insulating layer transversely to said channel;
   (e) a plurality of second electrodes lying on said insulating layer transversely to said channel in the spaces between said first electrodes;
   (f) a well region of dopant impurity atoms of a second type opposite to said first type under each of said first and second electrodes; each of said well regions extending transversely across said channel and along said channel from one transverse edge of a respective one of said electrodes to a medial portion of said electrode; wherein said insulating layer underlies each of said first electrodes by a first uniform thickness, underlies each of said second electrodes by a second uniform thickness, and separates each of said first electrodes from adjacent second electrodes by approximately said second thickness, with said second thickness being approximately 20% to 60% greater than said first thickness.

2. A charge coupled device according to claim 1 wherein said insulating layer is comprised of two different materials in the portions having said second uniform thickness.

3. A charge coupled device according to claim 1 wherein said second type dopant impurity atoms in said well regions have a greater charge density under said first electrodes than under said second electrodes.

4. A charge coupled device according to claim 3 wherein said charge density of said dopant atoms of said second type under said second electrodes is proportional to the ratio of said first uniform thickness to said second uniform thickness times the charge density of said second type dopant atoms under said first electrodes.

5. A charge-coupled device according to claim 1 and further including a second region of dopant impurity atoms of said second type under each of said second electrodes; each of said second regions lying relatively near said first surface and extending transversely across said channel and along said channel under a respective one of said second electrodes.

6. A charge coupled device according to claim 5 wherein said second region of dopant impurity atoms has a charge density of approximately $(1-7) \times 10^{11}$ atoms per $cm^2$, and said well region under said second electrodes has a charge density of approximately $(0.8-1.2) \times 10^{12}$ atoms per $cm^2$.

7. A charge coupled device according to claim 1 and further including a buried channel region of dopant impurity atoms of said second type containing said charge transfer channel.

8. A charge-coupled device according to claim 1 and further including a shallow region of dopant impurity atoms of said first type under each of said second electrodes, each of said shallow regions extending transversely across said channel and along said channel under a respective one of said second electrodes.

* * * * *